United States Patent [19]

Sato et al.

[11] Patent Number: 4,906,511
[45] Date of Patent: Mar. 6, 1990

[54] ALUMINUM NITRIDE CIRCUIT BOARD

[75] Inventors: Hideki Sato; Masakazu Hatori; Nobuyuki Mizunoya, all of Yokohama, Japan

[73] Assignee: Kabushiki Kaisha Toshiba, Kanagawa, Japan

[21] Appl. No.: 250,635

[22] Filed: Sep. 29, 1988

[30] Foreign Application Priority Data

Feb. 12, 1987 [JP] Japan .................................. 63-28976
Sep. 30, 1987 [JP] Japan .................................. 62-150264

[51] Int. Cl.⁴ .............................................. B32B 23/02
[52] U.S. Cl. ..................................... 428/192; 428/141;
428/148; 428/156; 428/209; 428/689; 428/698;
428/542.8; 428/901; 361/397; 174/256
[58] Field of Search .................. 361/397; 174/68.5;
428/209, 698, 689, 542.8, 901, 192, 141, 148, 156

[56] References Cited

U.S. PATENT DOCUMENTS

| | | | |
|---|---|---|---|
| 3,607,613 | 9/1971 | Passmore et al. | 428/698 |
| 4,456,641 | 6/1984 | Ohtani | 428/131 |
| 4,695,517 | 9/1987 | Okuno et al. | 428/698 |
| 4,756,976 | 7/1988 | Komeya et al. | 428/698 |
| 4,770,953 | 9/1988 | Horiguchi et al. | 428/209 |
| 4,777,060 | 10/1988 | Mayr et al. | 427/405 |
| 4,800,137 | 1/1989 | Okuno et al. | 428/698 |

FOREIGN PATENT DOCUMENTS 0235682 9/1987 European Pat. Off. .
1808666 9/1968 Fed. Rep. of Germany .

Primary Examiner—Ellis P. Robinson
Assistant Examiner—P. J. Ryan
Attorney, Agent, or Firm—Finnegan, Henderson, Farabow, Garrett and Dunner

[57] ABSTRACT

Disclosed is an aluminum nitride circuit board which is advantageously used as a carrier for a part emitting a large volume of heat, the substrate of the circuit board is a sintered aluminum nitride substrate which comprises a basal part and projection rising from the basal part and offering a surface for application of a metallizing composition, a metallized layer thereof is formed on the upper side of the projection by applying the metallizing composition thereon and forming the applied layer of the composition by firing, the metallizing composition applied on the upper side of the projection is prevented from sagging down the lateral side of the basal part owing to the step formed with the projection and the basal part, the preclusion of the otherwise inevitable sagging of the composition contributes greatly to improving the circuit board's voltage withstanding property. Owing to the curved surfaces formed in the rising part of the projection, the edge on the upper side of the projection, and the corner along the edge of the basal part, the production of the circuit boards enjoys a very yield and the circuit boards are projected against accidents due to the otherwise possible occurrence of cracks during service.

7 Claims, 1 Drawing Sheet

ALUMINUM NITRIDE CIRCUIT BOARD

FIELD OF THE INVENTION AND RELATED ART STATEMENT

The present invention relates to an aluminum nitride circuit board fit for use on such a part as an ignitor which emits a large volume of heat.

Heretofore, beryllia type ceramic substrates exhibiting an excellent heat-radiating property and relatively inexpensive alumina type finding popular acceptance as insulating bases have been used as the carriers which, like insulating substrates for ignitors, serve to support parts liable to emit a large volume of heat. The beryllia type substrates have a disadvantage that they are toxic and, therefore, must be handled carefully and they are expensive. The alumina type substrates are incapable of radiating heat emitted by a Si chip mounted thereon because they have no sufficient heat-radiating property ascribable to poor thermal conductivity. A remedy is needed which comprises superposing a layer of such a metal as copper or molybdenum rich in thermal conductivity in a prescribed thickness on the substrate. This remedy, however, entails an unwanted addition to cost.

In recent years, therefore, aluminum nitride ceramic substrates which are rich in thermal conductivity, excellent in electric insulation, and free from toxicity have been finding growing utility.

For various parts to be safely mounted on such a ceramic substrate, an electroconductive metallized layer such as of tungsten or molybdenum is formed on the surface of an aluminum nitride substrate, a conductive layer is further formed on the surface of the metallized layer by plating it as with nickel, and lead frame serving concurrently as semiconductor element and an electrode is connected to the conductive layer.

The metallized layer is formed by applying a pasty metallizing composition on the surface of the aluminum nitride substrate and firing the coated substrate thereby forming the metallized part.

In the case of the conventional aluminum nitride substrate, as illustrated in FIG. 4, the metallizing parts 2 applied on the surface 1b sags down the peripheral part 1a of the substrate and causes the substrate to suffer from loss of stability to withstand voltage. The sagging part of the metallizing composition has the possibility of sustaining a crack and consequently suffering from inferior metallization. When an aluminum nitride is used for an insulating substrate, since the aluminum nitride excels in heat-radiating property, an element possessing larger output is required to be mounted as compared with an alumina. Therefore, the withstand voltage of the aluminum nitride is largely affected with the sagging of the metallized part as mentioned above.

Further, the conventional aluminum nitride ceramic substrate has a rectangular shape and forms an acute corner in the edge part as illustrated in FIG. 4 and, therefore, are liable to substain cracks and chipping in the edge part during the course of manufacture. In the production of such aluminum nitride ceramic substrates, the susceptibility of the substrate to such innuries possibly increases the ratio of rejectables. Moreover, the poor yield coupled with great cost of raw materials for aluminum nitride forms a major cause for an increase in the cost of the aluminum nitride ceramic substrates.

This invention has been initiated for the solution of this problem. It is aimed at providing a ceramic substrate comprising sintered aluminum nitride of no appreciable high ratio of rejectables and, therefore, enjoying sufficiently high stability to withstand voltage enough to warrant safe use as a carrier for semiconductor elements of high output.

OBJECT AND SUMMARY OF THE INVENTION

The present invention concerns a circuit board comprising aluminum nitride ceramic substrate and a metallized layer formed by applying a metallizing paste on the surface of the ceramic substrate and hardening the applied layer of paste by firing, which circuit board is characterized by the fact that the application of the metallizing paste is made on the upper surface of a projection formed on one side of the sintered aluminum nitride piece, the part rising from one side of the projection of the sintered aluminum nitride piece possesses a gradually curved surface, and the edge part on the upper side of the projection and the edge part of the substrate each possess a gradually curved surface.

The sintered aluminum nitride piece to be used in the present invention is produced by mixing aluminum nitride powder with yttrium oxide or other similar metal oxide as a sintering aid, combining the resultant mixed powder with a binder, molding the resultant mixture in a stated shape, and sintering the molded mixture under normal pressure or under application of pressure of ambient atmosphere. For thorough radiation of heat, the thermal conductivity of the produced sintered aluminum nitride piece is required to be not less than 50 w/m.k. It may be treated by the hot press method, depending on the shape thereof.

The projection to be formed on one side of the sintered aluminum nitride piece may be in any shape so long as the upper side of the projection will serve effectively as the base for mounting. The angle formed between the lateral side of the projection and one side of the aluminum nitride substrate is desired to be at least 90°. The step formed by the projection and the base of this projection serves the purpose of preventing the metallizing composition from sagging down onto the surface of the sintered aluminum nitride piece outside the substrate and improving the stability to withstand voltage. The surface area and height of the upper surface of the projection vary with such factors as the size of the substrate, size of the part to be mounted thereon, and the working voltage to be used. If this surface area is very small, the surface for mounting is not sufficient. If it is very large, the effect mentioned above is not obtained. Thus, the surface area is desired to be approximately in the range of 50 to 90% of the surface area of the aluminum nitride substrate. The distance between the edge of the base of the projection and the peripheral edge of the aluminum nitride is desired to be at least 0.1 mm. The height of the projection is sufficient above the level of 0.2 mm.

The edge part on the upper side of the projection, the edge on the surface of the substrate, and the rising part of the projection are each desired to have a radius of curvature in the range of 0.01 to 0.5 mm.

By the sintering under normal pressure or under application of pressure of ambient atmosphere, the projection of the foregoing description can be formed easily. Otherwise, it may be formed by means of hot press.

The formation of the metallized layer is made on the upper side of the projection which has been formed on one side of the sintered aluminum nitride piece. To be specific, it is accomplished by applying a pasty metallizing composition on the upper side of the projection by the screen printing method and subsequently hardening the applied layer of the paste by firing. In this case, there is the possibility of the applied layer of paste sagging from the periphery of the upper side of the projection. The paste thus tending to flow down is completely stopped by the rising part and the bottom surface of the projection and prevented from sagging down to the peripheral surface of the aluminum nitride substrate. Thus, the finished circuit board cannot suffer from loss of the stability to withstand voltage.

The rising part of the projection has a gradually curved surface, the concentration of stress upon the rising part of the projection under the load exerted on the end part of the substrate is alleviated and the otherwise possible occurrence of cracks is precluded appreciably. Further, since the edge part on the upper side of the projection and the edge part of the substrate are similarly curved gradually, they hardly sustain chippings under impacts exerted thereon.

DETAILED DESCRIPTION OF THE INVENTION

Now, the present invention will be described in detail below with reference to working examples.

Figure 1:
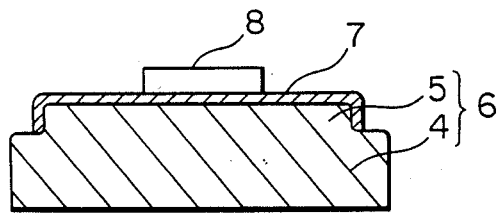
FIGS. 1 through 3 are the cross section views illustrating a circuit board obtained in the working examples of the present invention.
Figure 2:
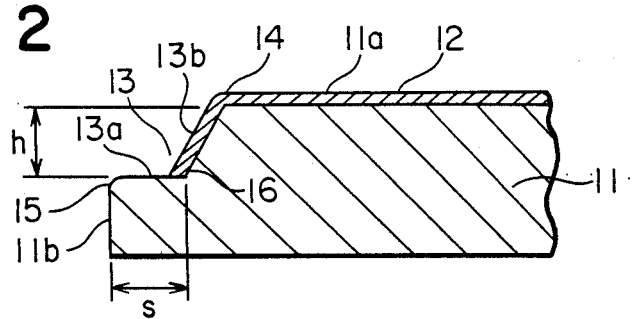

FIG. 1, FIG. 2 and FIG. 3 each illustrate the cross section of a circuit board obtained in the working examples of this invention. FIG. 4 is a diagram illustrating the cross section of the conventional aluminum nitride substrate.

EXAMPLE 1

Aluminum nitride powder in the mount of 96% by weight was thoroughly mixed with 4% by weight of yttrium oxide powder as a sintering aid. Then, 100 parts by weight of the resultant mixed powder and 30 parts by weight of an organic binder were mixed. A shaped piece of the resultant mixture comprising a basal part 4 measuring 10 mm × 10 mm in surface area and a projection 5 rising to a height of 0.5 mm above the basal part 4 leaving behind a border 0.5 mm in width all around the periphery was obtained by press molding. The overall height of this shaped piece was 3 mm. The shaped piece was defatted and then sintered in an atmosphere of nitrogen gas at a temperature of 1,800° C. for two hours to produce a ceramic substrate 6 of sintered aluminum nitride. This substrate was found to possess thermal conductivity of 170 w/m.k.

On the surface of the projection 5 of this ceramic substrate 6, an electroconductive layer 7 was formed by applying a metallizing composition solidly by the screen printing method and hardening the applied layer of the metallizing composition by sintering. This electroconductive metallized layer 7 was plated with nickel. Subsequenly, a semiconductor element 8 was mounted on the substrate and soldered thereto, to produce a semiconductor device.

A lot of 100 semiconductor devices produced as described above were tested for withstanding voltage. In the test, none of them showed any sign of decline of withstanding voltage due to sagging of the metallizing composition.

The perfect preclusion of the sagging of metallizing composition demonstrated in the test is logically explained by a supposition that the construction of the semiconductor device provided an ample distance between the edge of the applied layer of metallizing composition and the outer surface of the substrate and, if the metallizing composition tended to sag, the lateral side of the projection and the upper side of the substrate jointly prevented the progress of the sagging. As a result, the produced semiconductor device enjoyed a generous improvement in the voltage withstanding property.

EXAMPLE 2

FIG. 2 shows a circuit board produced in this working example. On the surface of an aluminum nitride substrate 11 possessing thermal conductivity of not less than 50 w/m.k, a metallized layer 12 of tungsten or molybdenum was formed. On the surface of the metallized layer 12, semiconductor element such as, for example, a silicon chip is mounted through the medium of an electroconductive layer (not shown) made of nickel or some other similar metal.

The surface 11a of the projection of the aluminum nitride substrate 11 was substantially parallel to the surface 13a of the basal part. The rising lateral side 13b of the projection was inclined by an angle of about 60° relative to the surface 11a of the projection. The distance (s) of the surface 13a of the basal part between the outer side 11b of the basal part of the aluminum nitride substrate 11 and the rising part of the projection in the direction toward to center of the substrate was 0.2 mm. The height (h) of the projection was 0.3 mm.

In this case, the edge part of the surface 11a of the projection of the aluminum nitride substrate 11, specifically an edge part 14 formed along the intersection between the surface 11 of the projection and the lateral side 13b of the rising part of the projection, and the edge part 15 along the intersection between the surface 13a of the basal part and the lateral side 11b of the outer periphery of the basal part were each gradually curved with a radius of curvature of 0.2 mm.

The formation of the metallized layer 12 was accomplished by applying the aforementioned pasty metallized composition in a prescribed thickness on the surface 11a of the projection of the aluminum nitride substrate 11 as far as the outer peripheral edge thereof by the printing method and thereafter hardening the applied layer of the composition by firing. In this case, the metallizing paste tended to sag down from the outer peripheral edge of the surface 11a of the projection of the aluminum nitride substrate. The lateral side 13b of the rising part of the projection and the surface 13a of basal part stopped the flow of the paste and prevented it from reaching the lateral side 11b of the outer periphery of the basal part. The aluminum nitride substrate 11 attained this preclusion of sagging because the step formed by the basal part and the projection was effective in curbing the progress of the sagging. Owing to this feature, the semiconductor element mounted on the substrate was allowed to withstand high voltage and exhibit a satisfactory voltage withstanding property as compared with the conventional countertype.

The edge 14 along the outer periphery of the projection and the edge 15 along the periphery of the basal part sustained absolutely no flaw because they were each gradually curved. Further, the rising part 16 of the projection suffered very little from the occurrence of crack due to concentration of stress because it was similarly curved gradually.

EXAMPLE 3

This example concerns an aluminum nitride substrates embodying the present invention otherwise than of Example 1 and Example 2.

Figure 3A:
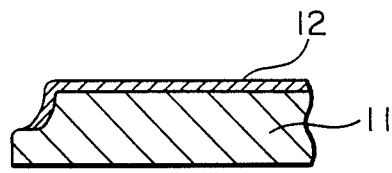
Figure 4:
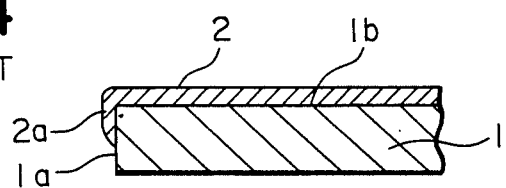
FIG. 4 is a diagram illustrating the cross section of the conventional aluminum nitride substrate.

FIG. 3a shows an embodiment in which the surface interconnecting the projection and the basal part of the aluminum nitride ceramic substrate was not flat but was curved. The ceramic substrate of this construction brought about the same effect as those of Example 1 and Example 2.

Figure 3B:
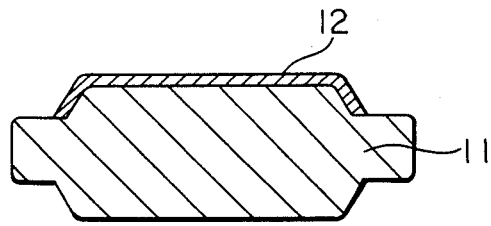

FIG. 3b shows an embodiment in which the shape of the aluminum nitride ceramic substrate showed symmetry between the upper and lower sections thereof. In this case, therefore, projections were formed on each on the upper and lower sides of the substrate. Since this ceramic substrate was usable alike on the upper and lower sides thereof, it could be randomly subjected to the step such as for a metallizing treatment without anxiety about choice between the sides. This, the subsequent steps could be controlled smoothly. In the other respects, the merits of this ceramic substrate were similar to those of Example 1 and Example 2.

As described above, the circuit board of the present invention has as a substrate for mounting the upper side of a projection formed on one side of the sintered aluminum nitride piece, it acquires an ample capacity for heat radiation and, at the same time, prevents the metallizing composition, while being applied by printing on the upper side of the projection, from sagging down and reaching the surface surrounding the basal part, and enjoys retention of a satisfactory voltage withstanding property.

Further, in accordance with the present invention, the corner of the outer peripheral edge of the basal and the rising part of the projection from the basal part as well as corner of the surface of the projection of the substrate for application of the metallizing paste are prevented from sustaining chippings and cracks because they are gradually curved. Thus, the aluminum nitride substrate is protected against possible loss of the voltage withstanding due to inferior metallization and is enabled to retain its quality on a high level.

What is claimed is:

1. An aluminum nitride circuit board, comprising:
   a ceramic substrate solely of aluminum nitride, said ceramic substrate comprising a basal part and a projection formed on said basal part; and
   a metallized layer formed on an upper surface of said projection, said metallized layer being produced by applying a metallizing composition on said upper surface of said projection and by firing said metallizing composition thereon while completely excluding said metallized layer from peripheral edge portions of said basal part; wherein an area of said upper surface of said projection is within the range of 50 to 98% of the surface area of said ceramic substrate;
   and said ceramic substrate having a thermal conductivity not less than 50 w/m.k.

2. The aluminum nitride circuit board of claim 1, wherein a rising part of said projection from a basal part thereof is gradually curved and an edge part surrounding the upper surface of said projection and an edge part surrounding said basal part are gradually curved.

3. The aluminum nitride circuit board of claim 2, wherein a distance from the rising part of said projection to the edge surrounding said basal part is at least 0.1 mm.

4. The aluminum nitride circuit board of claim 2, wherein the upper surface of said projection is substantially parallel to the surface of said basal part and a height of the upper surface of said projection from the surface of said basal part is at least 0.2 mm.

5. The aluminum nitride circuit board of claim 2, wherein the rising part of said projection from the basal part, the edge part surrounding the upper surface of said projection, and the edge part surrounding the basal part each have a radius of curvature in the range of 0.01 mm to 0.5 mm.

6. The aluminum nitride circuit board of claim 1, wherein said projection of said aluminum nitride circuit board is formed by press molding.

7. An aluminum nitride circuit board comprising:
   a ceramic substrate solely of aluminum nitride comprising a basal part and a projection formed on said basal part; and
   a metallized layer formed on an upper surface of said projection, said metallized layer being produced by applying a metallizing composition on said upper surface of said projection and by firing said metallizing composition thereon while completely excluding said metallizing layer from peripheral edge portions of said basal part;
   said ceramic substrate having a thermal conductivity not less than 50 w/m.k;
   a distance between an edge of a base of said projection and a peripheral edge of said ceramic substrate being at least 0.1 mm, and
   a height of said projection being greater than 0.2 mm.

* * * * *